United States Patent
Cheng et al.

(10) Patent No.: US 7,453,121 B2
(45) Date of Patent: Nov. 18, 2008

(54) BODY CONTACT FORMATION IN PARTIALLY DEPLETED SILICON ON INSULATOR DEVICE

(75) Inventors: Shui-Ming Cheng, Chu-pei (TW); Ka-Hing Fung, Hsin-chu (TW); Yin-Pin Wang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/743,985

(22) Filed: Dec. 22, 2003

(65) Prior Publication Data
US 2005/0133831 A1 Jun. 23, 2005

(51) Int. Cl.
*H01L 21/00* (2006.01)
(52) U.S. Cl. .............................. 257/347; 257/288
(58) Field of Classification Search ........... 257/288, 257/347
See application file for complete search history.

(56) References Cited

U.S. PATENT DOCUMENTS

| | | | |
|---|---|---|---|
| 6,074,908 A | 6/2000 | Huang | |
| 6,248,637 B1 | 6/2001 | Yu | |
| 6,297,103 B1 * | 10/2001 | Ahn et al. | 438/275 |
| 6,335,262 B1 * | 1/2002 | Crowder et al. | 438/440 |
| 6,413,802 B1 | 7/2002 | Hu et al. | |
| 6,420,218 B1 | 7/2002 | Yu | |
| 6,432,829 B2 | 8/2002 | Muller et al. | |
| 6,525,403 B2 | 2/2003 | Inaba et al. | |
| 6,720,221 B1 * | 4/2004 | Ahn et al. | 438/275 |
| 6,794,709 B2 * | 9/2004 | Ahn et al. | 257/315 |
| 6,833,308 B2 * | 12/2004 | Ahn et al. | 438/315 |
| 6,905,919 B2 * | 6/2005 | Chan et al. | 438/151 |
| 6,998,682 B2 * | 2/2006 | Chan et al. | 257/347 |
| 7,271,467 B2 * | 9/2007 | Noble et al. | 257/627 |
| 2002/0004276 A1 * | 1/2002 | Ahn et al. | 438/275 |
| 2002/0004277 A1 * | 1/2002 | Ahn et al. | 438/275 |
| 2003/0094660 A1 * | 5/2003 | Crowder et al. | 257/391 |
| 2005/0023608 A1 * | 2/2005 | Chan et al. | 257/347 |
| 2005/0133831 A1 * | 6/2005 | Cheng et al. | 257/288 |
| 2005/0208712 A1 * | 9/2005 | Chan et al. | 438/151 |
| 2007/0018247 A1 * | 1/2007 | Brindle et al. | 257/347 |
| 2007/0181947 A1 * | 8/2007 | Chan et al. | 257/351 |

OTHER PUBLICATIONS

Y.C. King ewt al., "Sub-5um Multiple Thickness Gate Oxide Technology Using Oxygen Implantation," Int. Electron Device Meeting (IEDM), San Francisco, paper 21.1.1, 1998).*

B. W. Min et al., "Reduction Of Hysteretic Propagation Delay With Less Performance Degradation By Novel Body Contact in PD SOI Application", 2002 IEEE International SOI Conference, Oct. 2002, pp. 169-170.

* cited by examiner

*Primary Examiner*—Laura M Menz
(74) *Attorney, Agent, or Firm*—Duane Morris LLP (57) ABSTRACT

An SOI device (100) has a gate electrode with one or more additional gate regions (120), and oxygen or halogen ions (128) under the additional gate regions (120). The oxygen or halogen ions (128) form thicker gate oxide regions or shallow trench isolation regions.

19 Claims, 7 Drawing Sheets

BODY CONTACT FORMATION IN PARTIALLY DEPLETED SILICON ON INSULATOR DEVICE

FIELD OF THE INVENTION

The invention relates to the field of a T-gate or H-gate silicon on insulator device, SOI device. The invention pertains to an SOI device having one or more additional gate regions including the T-gate and H-gate SOI devices.

BACKGROUND

For a T-gate or H-gate SOI device, with ultra-thin, or thin, gate oxide, the gate leakage current and parasitic capacitance in additional gate regions will increase Ioff-state leakage and degrade AC performance, respectively. AC performance is active circuit performance. Degraded AC performance is slower circuit speed of active circuits, for example, an inverter, a NAND gate or a NOR gate. The additional gate area increases Ioff and active power dissipation. Further, the low substrate dopant concentration under the additional gate region results in low efficiency of body contact for conventional T-gate and H-gate SOI devices.

A body contact structure is proposed according to B. W. Min et al., "Reduction Of Hysteretic Propagation Delay With Less Performance Degradation By Novel Body Contact in PD SOI Application, 2002 IEEE International SOI Conference, P. 169.

Min proposes a novel body contact structure by growing thicker gate oxide in additional gate regions so that the additional gate capacitance can be reduced. Min proposes a gate oxide of multiple thickness. The gate oxide is thinner under the gate where the gate crosses a channel region of the transistor between the source and drain regions of the transistor. The gate oxide is thicker under the gate polysilicon where the gate polysilicon extends in an additional gate region, so that additional gate capacitance, or gate loading capacitance, can be reduced. However, making the multiple thickness will require a complex set of design rules, and complex manufacturing controls.

SUMMARY OF THE INVENTION

The invention reduces gate leakage current and additional gate loading capacitance by introducing oxygen or a halogen, including, and not limited to, fluorine, under the additional gate region forming either a shallow trench isolation region, STI region, or a thicker gate oxide region.

Oxygen or halogen ion implants in the substrate under the additional gate region prevent gate leakage current and parasitic capacitance, or additional gate loading capacitance.

In an embodiment of the invention, oxygen or fluorine ion implant under the additional gate region reduces substrate resistance.

Embodiments of the invention will now be described by way of example with reference to the accompanying drawings.

DESCRIPTION OF THE DRAWINGS

FIGS 1A and 1B disclose a T-gate SOI device.
FIGS. 2A-2F discloses an H-gate SOI device.
FIGS. 2D-2F discloses a process for making the H-gate SOI device.
FIGS. 3A-3H disclose a process for making another embodiment of the H-gate SOI device.

DETAILED DESCRIPTION

Figure 1A:
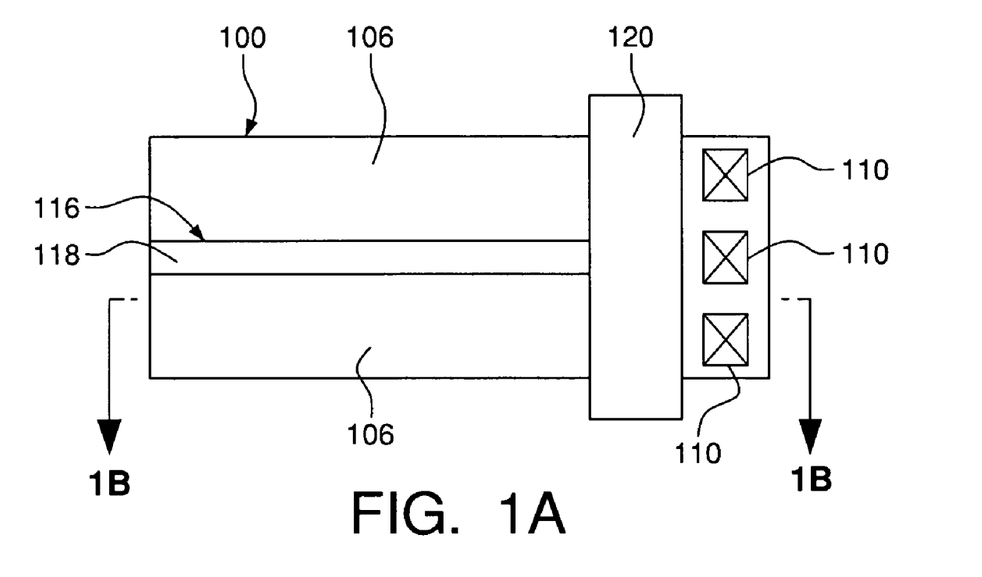
FIG. 1A is a plan view of a T-gate SOI device.

FIG. 1A discloses a T-gate SOI device (100) in a substrate (102) that is a portion of a semiconductor layer. For an NMOS SOI device (100), the substrate (102) of the semiconductor layer is a P-substrate (102) or N-substrate (102). For a PMOS SOI device (100), the substrate (102) of the semiconductor layer is an N-substrate (102). It is understood that the semiconductor layer is against a known BOX (104), buried oxide layer covering a semiconductor wafer, not shown. The semiconductor layer extends over the semiconductor wafer to provide multiple SOI devices (100) on the same semiconductor wafer. I/I regions are ion implant regions or ion implants in the semiconductor layer. N+ doped ion implants (106) form a source and drain for an NMOS SOI device in a P-substrate (102). P+ doped ion implants (106) form a source and drain for a PMOS SOI device (100) in an N-substrate (102).

Figure 1B:
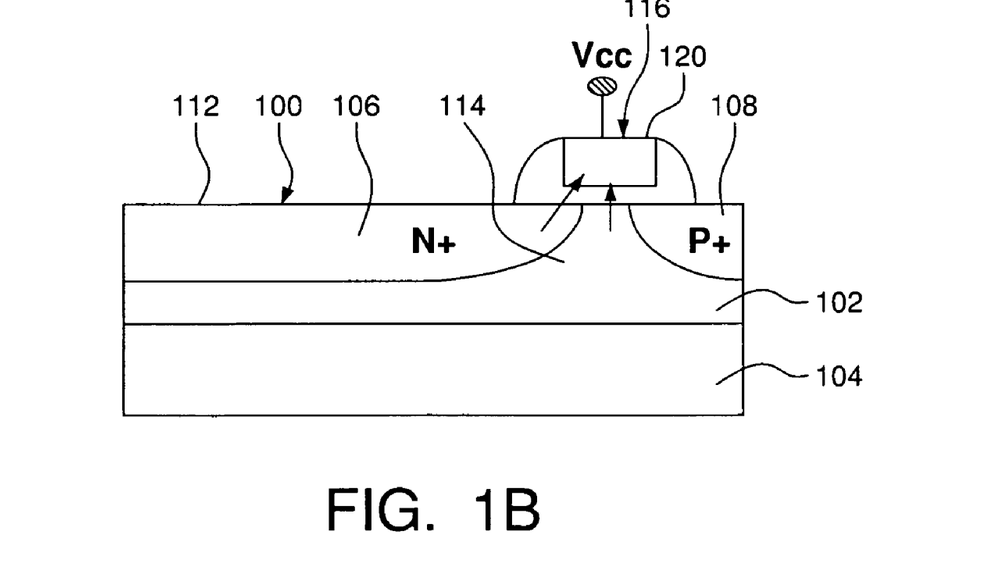
FIG. 1B is a cross section view of the T-gate SOI device.

FIG. 1B discloses the N+ doped drain ion implant (106) of an NMOS SOI device (100). FIG. 1B discloses P+ doped implants (108) in the substrate (102) that form recessed electrical contacts (110) at the top surface (112) of the substrate (102). FIG. 1B discloses a P well (114) of a P substrate (102) for an NMOS SOI device (100), or an N well (114) of an N substrate (102) for a PMOS SOI device (100). The P substrate (102) or N substrate (102) is against a BOX (104) for electrical isolation of the H-gate SOI formed in the silicon semiconductor layer.

FIG. 1A discloses that a gate electrode (116) has a T-shape to provide a transistor gate (118) extending over a channel region of the SOI device (100). The channel region is in the substrate (102) under the gate (118) of the SOI device (100). The gate electrode (116) has an additional gate region (120) at a respective end of the gate (118). The additional gate region (120) is joined to the transistor gate (118) to provide the H-shape of the H-gate SOI device (100).

Figure 2A:
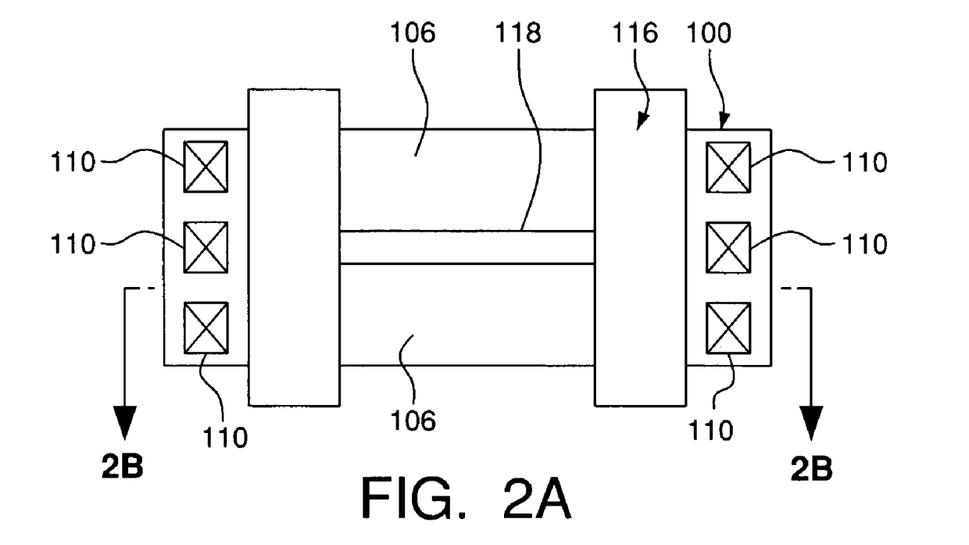
FIG. 2A is a plan view of an H-gate SOI device.

FIG. 2A discloses an H-gate SOI device (100) in a substrate (102) that is a portion of a semiconductor layer. For an NMOS SOI device (100), the substrate (102) of the semiconductor layer is a P-substrate (102) or N-substrate (102). For a PMOS SOI device (100), the substrate (102) of the semiconductor layer is an N-substrate (102). It is understood that the semiconductor layer is against a known BOX (104) covering a semiconductor wafer, not shown. The semiconductor layer extends over the semiconductor wafer to provide multiple SOI devices (100) on the same semiconductor wafer. I/I regions are ion implant regions or ion implants in the substrate (102) N+ doped ion implants (106) form a source and drain for an NMOS SOI device (100) in a P-substrate (102). P+ doped ion implants (106) form a source and drain for a PMOS SOI device (100) in an N-substrate (102).

Figure 2B:
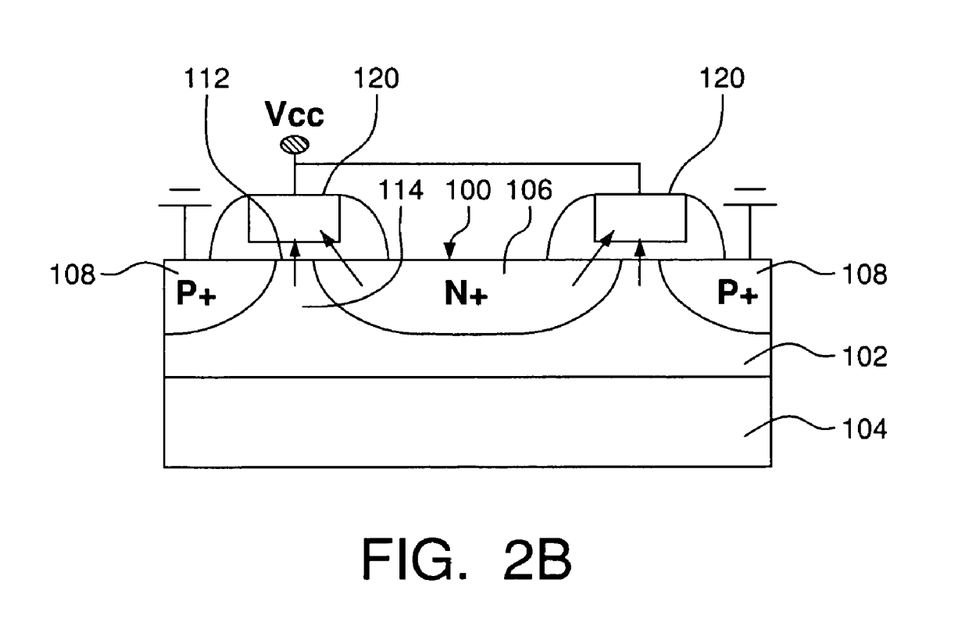
FIG. 2B is a cross section view of the H-gate SOI device.

FIG. 2B discloses the N+ doped drain region of an NMOS SOI device (100). FIG. 2B discloses P+ doped implants (108) in the substrate (102) that form recessed electrical contacts (110) at the top surface (112) of the substrate (102). FIG. 2B discloses a P well (114) of a P substrate (102) for an NMOS SOI device (100), or an N well (114) of an N substrate (102) for a PMOS SOI device (100). The P substrate (102) or N substrate (102) overlies an insulating layer. The insulating layer is a BOX (104), buried oxide, layer for electrical isolation of the H-gate SOI formed in the silicon semiconductor layer.

FIG. 2A discloses that a gate electrode (116) has an H-shape with a transistor gate (118) extending over a channel region of the SOI device (100). The channel region is in the substrate (102) under the gate (118) of the SOI device (100). The gate electrode (116) has additional gate region (120) at respective ends of the gate (118). The additional gate region (120) are joined to the transistor gate (118) to provide the H-shape of the H-gate SOI device (100).

Thus the invention pertains to an SOI device (100) that has one or more, or at least one, additional gate region (120) at respective ends of a transistor gate (118), which includes, and is not limited to, a T-gate SOI device (100) and an H-gate SOI device (100).

A conventional T-gate or H-gate SOI device (100) would have the following disadvantages. A high body contact resistance results in a floating body effect. Additional gate region (120) increases Ioff and active power dissipation. Additional gate capacitance, or parasitic capacitance, degrades the AC performance. The voltage drop between the LDD source-drain extensions and each additional gate region (120) will cause gate leakage current with Vdd, a drain side voltage, in the off-state mode of the SOI device (100).

Figure 2C:
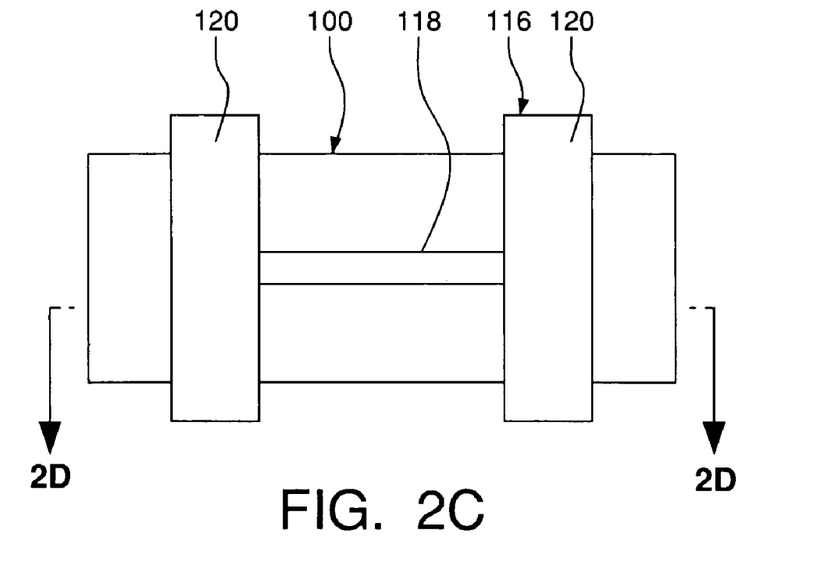
FIG. 2C is a plan view of an H-gate SOI device.

FIGS. 2C-2F discloses an H-gate SOI device (100) and a method according to the invention. FIG. 2C discloses a gate electrode (116) with two additional gate regions (120) at respective ends of a transistor gate (118). It should be understood that the invention pertains to, and is not limited by, either an H-gate SOI device (100) or a T-gate SOI device (100) described as having one or more additional gate regions (120). The one or more additional gate regions (120) are at respective ends of a transistor gate (118).

Figure 2D:
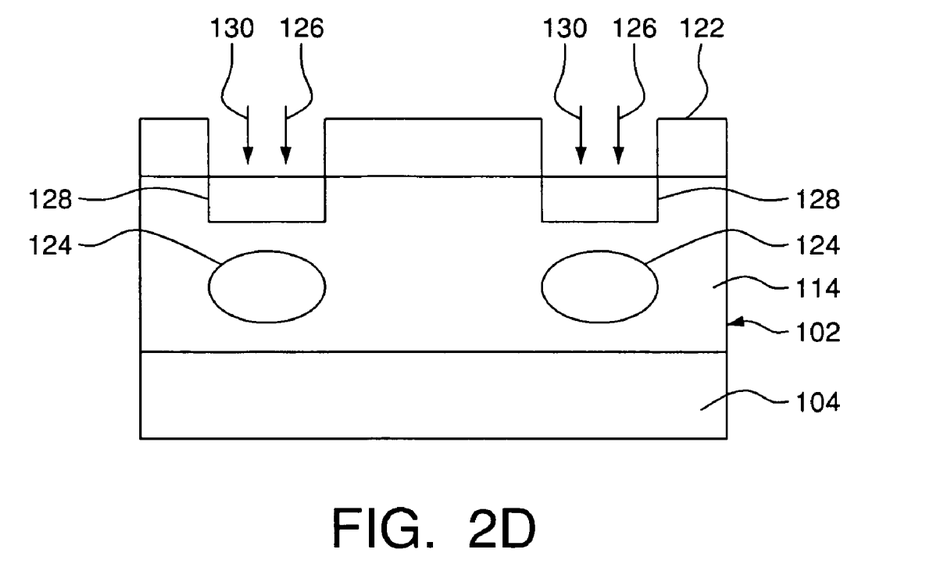
FIG. 2D is a cross section view, along the line 2D-2D of FIG. 2C, that discloses ion implantation and oxygen or fluorine implantation, followed by annealing.

FIG. 2D discloses a P-substrate (102) in the form of a well (114) for ion implants in a semiconducting layer. The semiconductor layer is against a BOX (104). It is understood that the BOX (104) is a layer on a semiconductor wafer, not shown. FIG. 2D discloses a PR (122), patterned resist, or patterned mask, against a top surface (112) of the P-substrate (102). The PR (122) has an opening located at an additional gate area. Each additional gate area will be at the top surface (112) and under an additional gate region (120) to be formed.

Deep ion implants (124) are implanted through each opening of the PR by performing deep ion implantation at (126). The ion implants (124) are P-type for an NMOS transistor, and N-type for a PMOS transistor. The ion implants (124) are under the additional gate areas. Further, the ion implants (124) are under oxygen or fluorine implants (128).

Shallow oxygen ions (128), or, alternatively, fluorine ions (128) are implanted as oxygen or fluorine ion implants (128) through each opening in the PR (122) by performing shallow ion implantation at (130). After implantation is completed, the PR (122) is removed.

The invention reduces gate leakage current and additional gate loading capacitance by oxygen or fluorine under each additional gate region (120) forming either a shallow trench isolation region, STI region, or a thicker gate oxide region.

Oxygen or fluorine ion implants (128) in the substrate (102) under each additional gate region (120) serve as gate oxide regions and reduce gate leakage current and parasitic capacitance due to additional gate loading capacitance. Further, substrate (102) resistance is reduced under each additional gate region (120). Since only portions of the substrate (102) include the oxygen or fluorine ion implants (128), the oxygen or fluorine ion implants (128) are seen to be "discrete" implant regions that extend to the to surface (112) of the substrate (102) and form gate oxide regions in the substrate.

With reference to FIG. 2D, annealing is performed to repair and improve the structure of the well (114) and of the P-type implants (108) and the oxygen or fluorine implants (128).

Figure 2E:
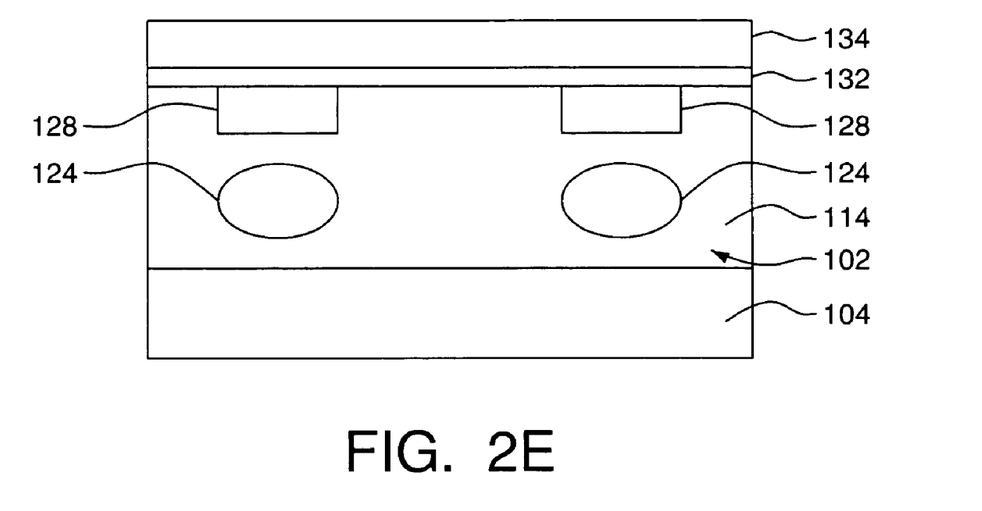
FIG. 2E is a cross section view that discloses application of a gate oxide material and application of gate electrode material.

With reference to FIG. 2E, a thin gate oxide layer (132), or gate insulation layer, is applied or formed as a thin layer against the top surface (112). FIG. 2E illustrates that the thin gate oxide layer (132) is of uniform thickness. The gate oxide layer (132) covers the oxygen or fluorine implants (128), at the top surface (112),i.e., the thin gate oxide layer (132) does not encroach the oxygen or fluorine implants 128. The gate oxide layer (132) combines with the oxygen or fluorine ion implants (128). i.e., substrate gate oxide regions, to form a gate oxide on the substrate, with the gate oxide being thicker by having the oxygen or halogen ions providing gate oxide regions, i.e., oxygen or fluorine ion implants (128), in the substrate. In other words, the gate oxide consists of the gate oxide layer (132) and gate oxide regions, oxygen or fluorine ion implants (128). As such, the gate oxide is thicker in areas where the gate oxide layer (132) is formed over a discrete oxygen or fluorine ion implant (128) region than it is in areas where the gate oxide layer (132) does not cover a discrete oxygen or fluorine ion implant (128). Then a thick layer of gate electrode material, for example, a polysilicon layer (134) of polysilicon layer (134) is applied against the gate oxide layer (132). The polysilicon layer (134) is applied by deposition, for example. Selective etching is performed to selectively remove the portions of the polysilicon layer (134), which forms the gate (118) and each additional gate region (120), as disclosed by FIG. 2F.

Selective etching is performed by covering the regions that would be exposed to etching with a patterned mask. A common mask material, such as a photoresist, PR, is deposited on the regions, followed by patterning the mask material with openings. The openings through the patterned mask expose regions to be removed by etching. Etching is performed to selectively remove the regions exposed at the openings.

Figure 2F:
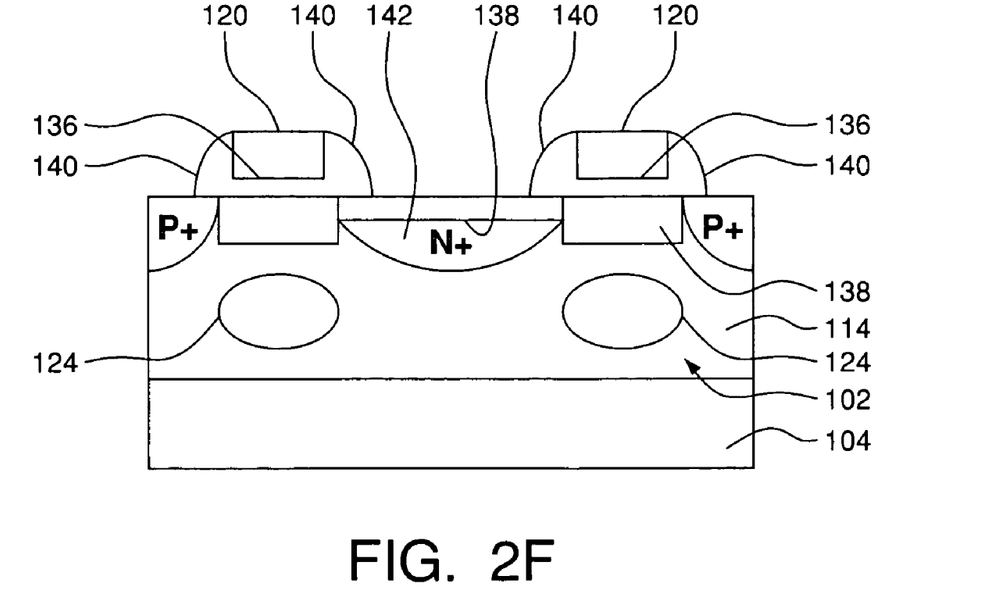
FIG. 2F is a cross section view that discloses selective etching of the gate electrode material and the gate oxide material, followed by fabrication of spacers (140) and source-drain ion implantation.

FIG. 2F discloses the thin gate oxide (136) under each additional gate region (120). The gate oxide layer (132) is removed except where the gate oxide (136) is under each additional gate region (120). For example, the gate oxide layer (132) is removed during the etching step to selectively remove the polysilicon layer (134). Alternatively, the gate oxide layer (132) is removed by a separate etching step.

LDD, lightly doped drain implantation, or S/D extension implantation is performed to produce shallow source and drain regions (138). After annealing, they become shallow source and drain extensions (138) respectively. The shallow source and drain regions (138) are shallow ion implants, for example, N+ doped source and drain regions (138) for an NMOS SOI device (100), or P+ doped source and drain regions (138) for a PMOS SOI device (100). FIG. 2F discloses the shallow N+drain region (138) for an NMOS device. The shallow N+ source region is similar.

FIG. 2F discloses spacers (140) of silicon on opposite side walls of the additional gate region (120). The spacers (140) are of a spacer material, silicon nitride, for example, created by selective epitaxy, for example. The spacers (140) and the additional gate region (120) cover the oxygen implants (128) or the fluorine implants (128), thereunder. The spacers (140) and the additional gate region (120) cover the deep and high, or shallow, substrate dopant ion implants (124), thereunder.

FIG. 2F discloses deep source and drain regions (142), respectively. Deep source-drain ion implantation is performed through openings in a patterned mask (144), as disclosed by FIG. 3G, that covers the top surface (112) except where the source and drain regions (142) are formed. The patterned mask (144) covers the source-drain ion implants. During implantation, each of the oxygen implants (128) or the fluorine implants (128) is covered by a corresponding additional gate region (120) and the spacers (140) on the sidewalls. Each of the substrate dopant ion implants (124) is covered by a corresponding additional gate region (120) and the spacers (140) on the sidewalls. The covered structure is protected from ion implantation. Following implantation, the mask (144) is removed.

FIG. 2F discloses electrical contacts (110) at the top surface (112) of the P-substrate (102). The electrical contacts (110) are formed by deep P+ ion implants (108) recessed in the top surface (112). P+ ions are for an NMOS SOI device (100). For a PMOS SOI device (100) N+ ions are implanted to form the electrical contacts (110). The P+ or N+ ion implants (108) are formed by ion implantation through openings in a patterned mask, for example, the patterned mask (148) disclosed by FIG. 3H. The patterned mask (148) covers the top surface (112) except where the electrical contacts (110) are formed. During implantation, each of the oxygen implants (128) or the fluorine implants (128) is covered by a corresponding additional gate region (120) and the spacers (140) on the sidewalls. Each of the ion implants (124) is covered by a corresponding additional gate region (120) and the spacers (140) on the sidewalls. The covered structure is protected from ion implantation. Following implantation, the mask (148) is removed.

Annealing is performed to improve the structure of the well (114). Annealing improves the structure of the P+ ion implants (108) of the electrical contacts (110) and the N+ drain and source regions (138) and (142). The shallow source and drain regions (138) form source and drain extensions (138) of an enhancement mode SOI device (100). Alternatively, an accumulation mode SOI device (100) would be fabricated without shallow source and drain extensions (138). An accumulation mode SOI device would be fabricated by performing the method steps discussed in FIGS. 2D-2F, but without performing the method step, of implanting the LDD, lightly doped drain implantation, or S/D extension implantation to produce shallow source and drain extensions (138), respectively.

Figure 3A:
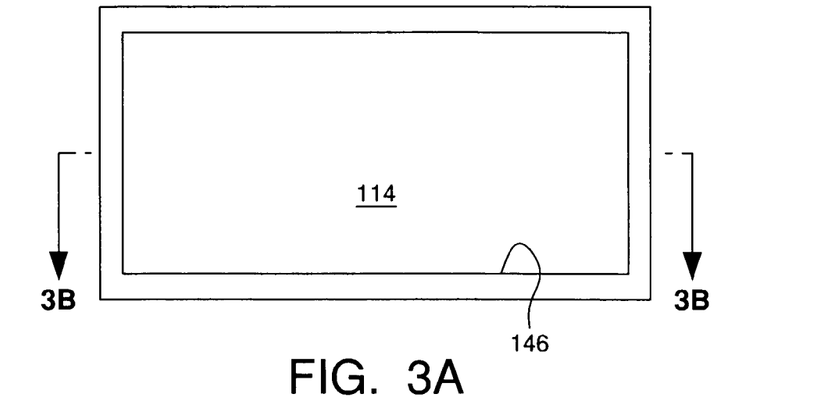
FIG. 3A is a plan view of an H-gate SOI device with STI.
Figure 3B:
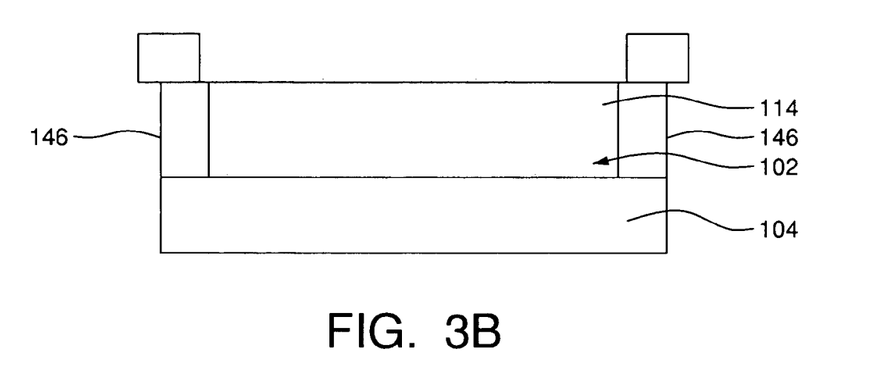
FIG. 3B is a cross section view of the H-gate SOI device of FIG. 3A.

FIGS. 3A and 3B disclose an embodiment wherein, the P well (114) or N well (114) is in an enclosure encircled by an STI region (146), shallow trench isolation region. The STI region (146) is formed in the semiconductor substrate (102) by known process steps.

Figure 3C:
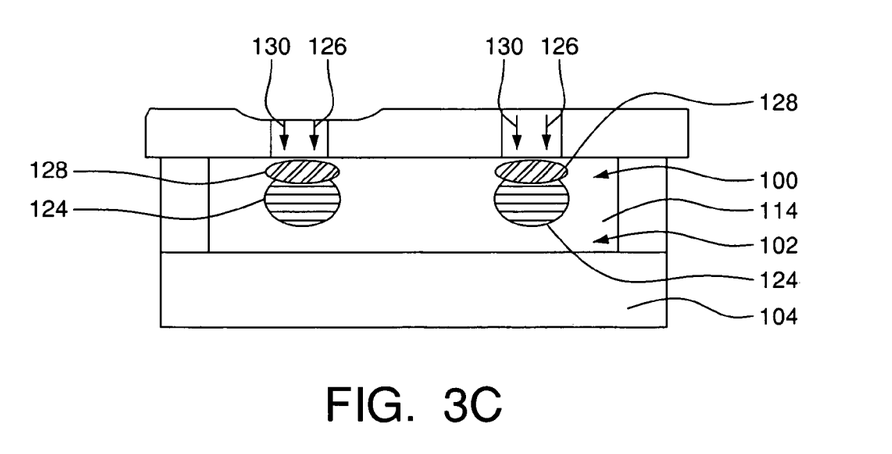
FIG. 3C is a cross section view that discloses P or N ion implantation and oxygen or fluorine ion implantation.

FIG. 3C discloses the PR (122), patterned resist, or patterned mask covering the regions except where ions are to be implanted. Deep ion implantation is performed to implant the P+ doped ion implants (124) of a P well (114) for an NMOS SOI device (100) or N+ doped ions for an N well (114) of a PMOS SOI device (100). Shallow ion implantation is performed to implant oxygen or fluorine ion implants (128). Following implantation the PR (122) is removed. Annealing is performed in the manner discussed with reference to FIG. 2B.

Figure 3D:
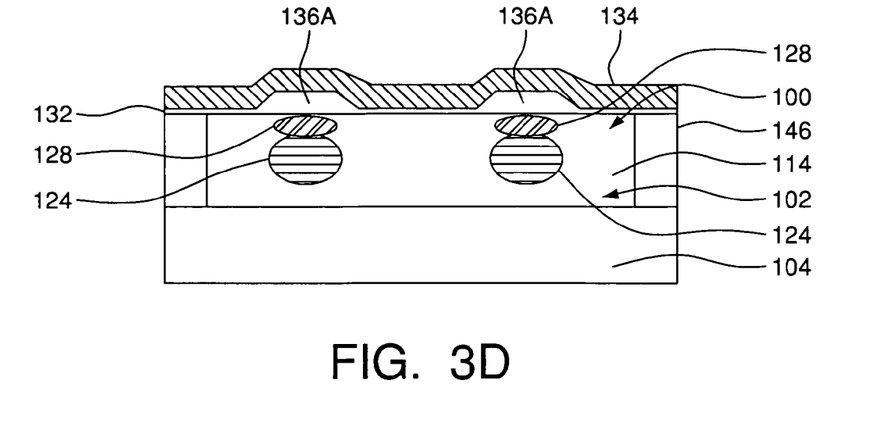
FIG. 3D is a cross section view that discloses application of a gate oxide material and application of a gate electrode material.

FIG. 3D discloses a thin gate oxide layer (132) against the STI region (146) and the top surface (112) of the substrate (102). A thicker, or thick, gate oxide (136A) is formed, for example, by selective epitaxy, to grow the thicker gate oxide (136A) at each region where an additional gate region (120) is desired. For example, the thin gate oxide layer (132) can be used as a thin gate oxide (136) under another SOI device (100) fabricated outside of the STI region (146), elsewhere on a semiconductor wafer. Thus, multiple SOI device (100)s can be fabricated on a semiconductor wafer.

FIG. 3D discloses a thick layer of gate electrode material, for example, a polysilicon layer (134) is applied against the gate oxide layer (132). The polysilicon layer (134) is applied by deposition, for example. Selective etching is performed to selectively remove the portions of the polysilicon layer (134), which forms the gate (118) and each additional gate region (120) disclosed by FIG. 3E.

Figure 3E:
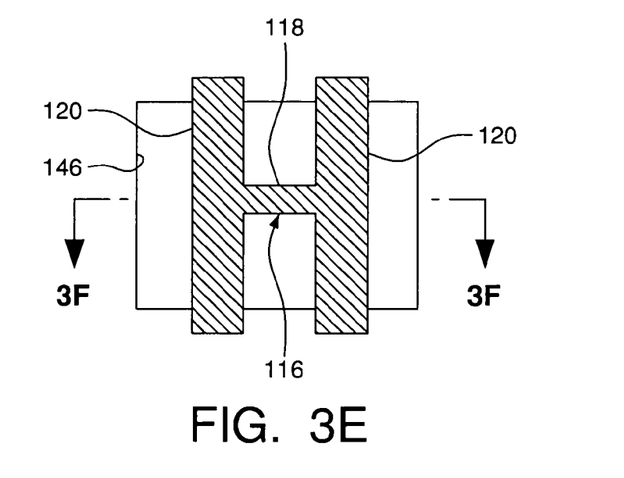
FIG. 3E is a plan view of the embodiment disclosed by FIG. 3F
Figure 3F:
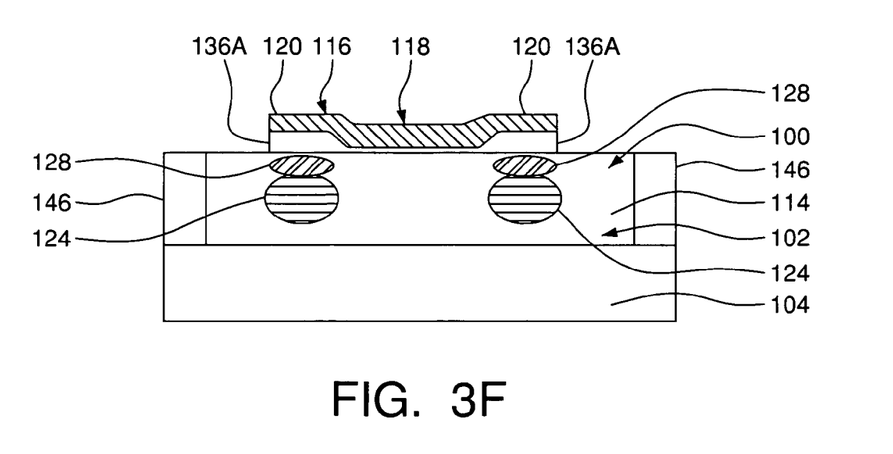
FIG. 3F is a cross section view, along the line 3F-3F of FIG. 3E, that discloses selective etching of the gate electrode material and the gate oxide material.

FIG. 3E discloses a gate (118) of the SOI device (100), and one or more additional gate region (120). FIG. 3F discloses the gate (118) on a thin gate oxide (136), and one or more additional gate region (120) on respective thicker, or thick, gate oxides (136A). The gate (118) and each additional gate region (120) are formed by selective etching, for example, according to the method steps discussed with reference to FIGS. 2C and 2D.

FIG. 3F discloses that under each additional gate region (120) is a corresponding oxygen or fluorine implant (128). Under each additional gate region (120) is an ion implant (124) corresponding to a P-type ion implant for an NMOS SOI device (100) or an N-type ion implant for a PMOS SOI device (100). These are formed by performing the process steps discussed with reference to FIGS. 2D-2F.

Figure 3G:
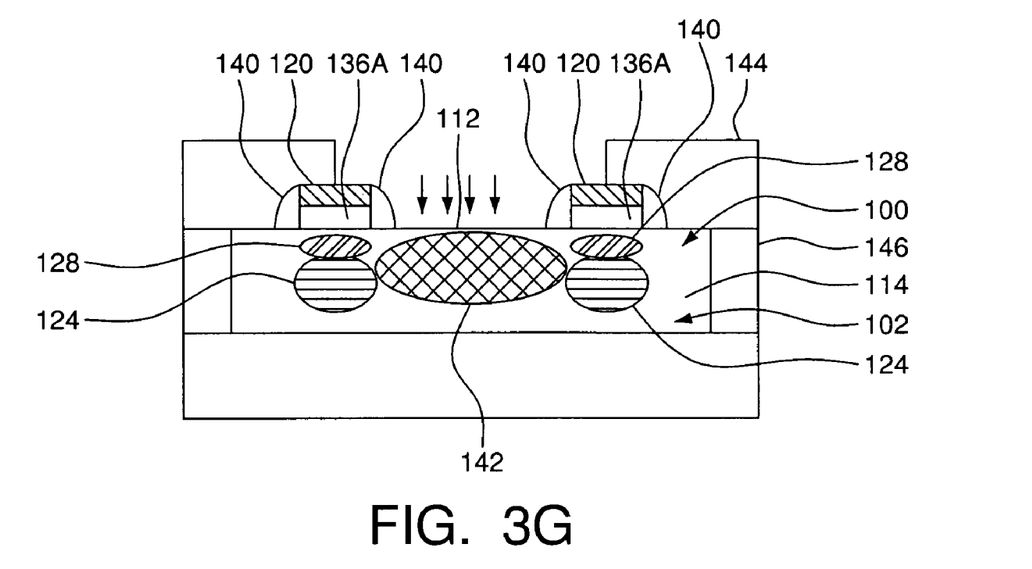
FIG. 3G is a cross section view that discloses deep source-drain ion implantation.

FIG. 3G discloses the PR, photoresist or patterned mask (144) covering the STI region (146) and the top surface (112) of the substrate (102) except at locations for forming deep source and drain regions (142) of the SOI device (100). Deep source and drain regions (142), respectively, are formed by ion implantation by performing the process steps discussed with reference to FIG. 2D. Following completed implantation the mask (144) is removed.

FIG. 3G discloses that the deep source and drain regions (142) exist without the shallow source and drain regions (138) disclosed by FIG. 2D. Thereby, the source and drain regions (142) are without the source and drain extensions (138) to comprise an accumulation mode SOI device (100). Alternatively, the shallow source and drain regions (138) would be added by performing the process steps discussed with reference to FIG. 2D, which would fabricate an enhancement mode SOI device (100).

Figure 3H:
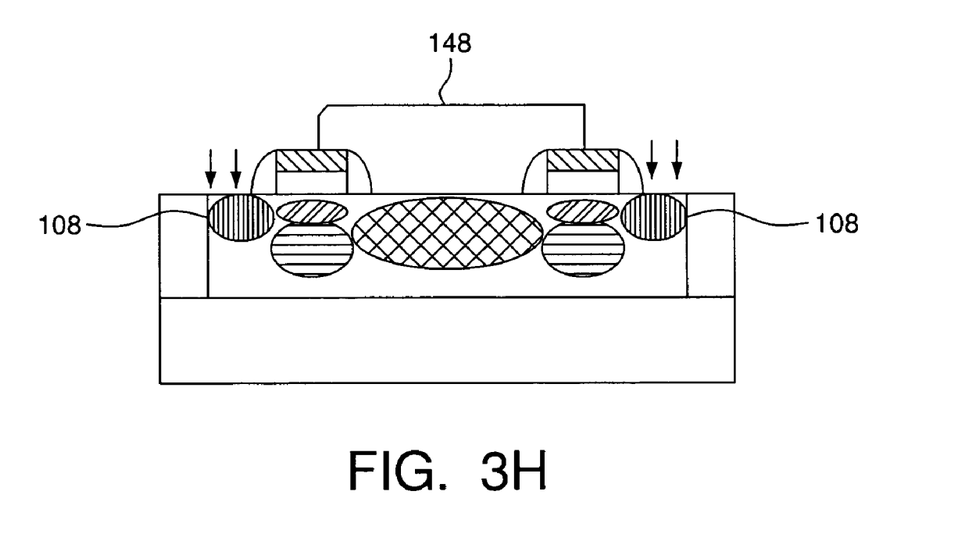
FIG. 3H is a cross section view that discloses deep source P+ or N+ ion implantation.

FIG. 3H discloses electrical contacts (110) at the top surface (112) of the P-substrate (102). The electrical contacts (110) are formed by deep P+ ion implants (108) recessed in the top surface (112). P+ ions are for an NMOS SOI device (100). For a PMOS SOI device (100) N+ ions are implanted to form the electrical contacts (110). The P+ or N+ ion implants (108) are formed by ion implantation through openings in a patterned mask (148), PR, that covers the top surface (112) except where the electrical contacts (110) are formed. The patterned mask (148) covers the source-drain ion implants (142). During implantation, each of the oxygen implants (128) or the fluorine implants (128) is covered by a corresponding additional gate region (120) and the spacers (140) on the sidewalls. Each of the ion implants (124) is covered by a corresponding additional gate region (120) and the spacers (140) on the sidewalls. The covered structure is protected from ion implantation. Following implantation, the mask (148) is removed.

Embodiments of the invention have been described. Other embodiments and modifications are intended to be covered by the spirit and scope of the appended claims.

The invention claimed is:

1. An SOI device having a gate, comprising:
   oxygen ions providing discrete implant regions in a substrate of an SOI device, the discrete implant regions extending to a surface of the substrate;
   one or more additional gate regions forming an H-gate or a T-gate and covering all discrete implant regions under the one or more additional gate regions, and
   a gate oxide layer covering but not encroaching the discrete implant regions and being under the one or more additional gate regions, the gate oxide layer including a thin gate oxide layer, and a thicker gate oxide layer covering the discrete implant regions,
   the discrete implant regions forming gate oxide regions and reducing substrate resistance under each of the additional gate regions.

2. The SOI device as recited in claim 1, further comprising:
   implanted ions in the substrate, the one or more additional gate regions covering the implanted ions.

3. The SOI device as recited in claim 1, further comprising:
   a gate of the SOI device.

4. The SOI device as recited in claim 1, further comprising:
   a gate electrode layer forming an SOI device gate and the one or more additional gate regions.

5. The SOI device as recited in claim 1, further comprising:
   an SOI device gate and the one or more additional gate regions being formed from a gate electrode layer; and
   wherein the gate oxide layer is under the gate and under the one or more additional gate regions.

6. The SOI device as recited in claim 1, further comprising:
   an SOI device gate on the thin gate oxide layer; and
   the one or more additional gate regions being on the thicker gate oxide layer.

7. The SOI device as recited in claim 1, further comprising:
   the thicker gate oxide layer being a selective epitaxy growth.

8. The SOI device as recited in claim 1, further comprising:
   the substrate having an STI enclosure for the discrete implant regions.

9. An SOI device having a gate, comprising:
   oxygen ions providing discrete implant regions in a substrate of an SOI device, the discrete implant regions extending to a surface of the substrate;
   one or more additional gate regions forming an H-gate or a T-gate and covering the discrete implant regions, and,
   a gate oxide layer formed over the surface and covering the discrete implant regions and being under the one or more additional gate regions, the gate oxide layer having a greater thickness over the discrete implant regions than over regions other than the discrete implant regions,
   the discrete implant regions forming gate oxide regions and reducing substrate resistance under each of the additional gate regions.

10. The SOI device of claim 1, further comprising doped ion implants under at least one of the one or more additional gate regions, the doped ion implants forming a source and drain in the substrate.

11. The SOI device of claim 10 wherein the substrate is a P-substrate, and the doped ion implants are N+ doped ions.

12. The SOI device of claim 10 wherein the substrate is an N-substrate, and the doped ion implants are P+ doped ions.

13. The SOI device of claim 9, further comprising doped ion implants under at least one of the one or more additional gate regions, the doped ion implants forming a source and drain in the substrate.

14. An SOI device having a gate, comprising:
   a plurality of gate regions forming an H-gate or a T-gate and covering thick oxide regions and thin oxide regions,
   each said thick oxide region comprising a discrete implant region of oxygen ions formed in a substrate of an SOI device and extending to a surface of the substrate, and an oxide layer formed over but not encroaching the surface; and
   each said thin oxide region comprising only said oxide layer,
   said oxide layer having substantially the same thickness in said thick oxide regions and said thin oxide regions.

15. The SOI device of claim 14, further comprising doped ion implants under at least one of the plurality of gate regions, the doped ion implants forming a source and drain in the substrate.

16. The SOI device of claim 15 wherein the substrate is a P-substrate, and the doped ion implants are N+ doped ions.

17. The SOI device of claim 15 wherein the substrate is an N-substrate, and the doped ion implants are P+ doped ions.

18. The SOI device of claim 15 wherein each of the plurality of gate regions is formed of polysilicon and includes sidewall spacers on opposed sidewalls thereof.

19. The SOI device of claim 14 wherein each of the plurality of gate regions is formed of polysilicon.

* * * * *